United States Patent [19]

Maiti et al.

[11] Patent Number: 6,020,024
[45] Date of Patent: Feb. 1, 2000

[54] METHOD FOR FORMING HIGH DIELECTRIC CONSTANT METAL OXIDES

[75] Inventors: Bikas Maiti; Philip J. Tobin; Rama I. Hegde, all of Austin; Jesus Cuellar, LaGrange, all of Tex.

[73] Assignee: Motorola, Inc., Schaumburg, Ill.

[21] Appl. No.: 08/905,755

[22] Filed: Aug. 4, 1997

[51] Int. Cl.[7] .......................... C23C 16/00; H01L 21/336
[52] U.S. Cl. .................. 427/248.1; 427/99; 427/527; 427/255.7; 427/309; 438/287
[58] Field of Search .................. 427/99, 248.1, 427/527, 255.7, 309; 438/287, 439, 453; 204/192.15

[56] References Cited

U.S. PATENT DOCUMENTS

| | | | |
|---|---|---|---|
| 5,225,031 | 7/1993 | McKee et al. | 156/612 |
| 5,374,586 | 12/1994 | Huang et al. | 438/439 |
| 5,450,812 | 9/1995 | McKee et al. | 117/84 |
| 5,804,492 | 9/1998 | Shen | 438/439 |
| 5,834,353 | 11/1998 | Wu | 438/287 |

FOREIGN PATENT DOCUMENTS

0690487 A1   1/1996   European Pat. Off. ...... H01L 21/316

OTHER PUBLICATIONS

Momiyama, et al., "Ultra–Thin Ta2O5/SiO2 Gate Insulator with TiN Gate Technology for 0.1 μm MOSFET's", Symposium on VLSI Technology Digest of Technical Papers; pp. 135–136 (1997).

Kawkubo, et al., "Novel Ferroelectric Epitaxial (Ba,Sr) TiO3 Capacitor for Deep Sub–Micron Memory Applications", IEDM, pp. 695–698 (1996).

Lyu, et al., "Metal–Ferroelectric–Semiconductor Field–Effect Transistor (MFSFET) for Single Transistor Memory by Using Poly–Si Source/Frain and BaMgF4 Dielectric", IEDM, pp. 503–506 (1996).

Kwon, et al., "Ta2O5 Capacitors for 1 Gbit DRAM and Beyond", IEDM, pp. 835–838 (1994).

Kamiyama, et al. "Characterization of Ultra–Thin Capacitors Fabricated Using RTN Treatment Prior to CVD Ta2O5 Film Formation", Extended Abstracts of the 1992 International Conf on Solid State Devices and Materials, Tsukuba, pp. 521–526 (1992).

Nakata, et al., "W–Gate MOSFETs with Ta2O5/SiO2 Gate Insulator", Extended Abstracts of the 21st Conference on Solid State Devices and Materials, pp. 545–555 (1989).

*Primary Examiner*—Roy V. King
*Attorney, Agent, or Firm*—Keith E. Witek

[57] ABSTRACT

A method for forming a metal gate (20) structure begins by providing a semiconductor substrate (12). The semiconductor substrate (12) is cleaned to reduce trap sites. A nitrided layer (14) having a thickness of less than approximately 20 Angstroms is formed over the substrate (12). This nitrided layer prevents the formation of an oxide at the substrate interface and has a dielectric constant greater than 3.9. After the formation of the nitrided layer(14), a metal oxide layer (16) having a permittivity value of greater than roughly 8.0 is formed over the nitrided layer (14). A metal gate (20) is formed over the nitrided layer whereby the remaining composite gate dielectric (14 and 16) has a larger physical thickness but a high-performance equivalent oxide thickness (EOT).

26 Claims, 1 Drawing Sheet

METHOD FOR FORMING HIGH DIELECTRIC CONSTANT METAL OXIDES

CROSS-REFERENCE TO RELATED APPLICATION

The present invention relates to the following commonly assigned co-pending applications:

1) "Semiconductor Device and a Process for Forming the Device," by Maiti, et al., filed Mar. 31, 1997, as Ser. No. 08/831,286;
2) "Semiconductor Device and a Process for Forming the Device," by Nguyen, et al., filed Mar. 31, 1997, as Ser. No. 08/831,287; and
3) "A Method for Manufacturing a High Dielectric Constant Gate Oxide for Use in Semiconductor Integrated Circuits," by Tseng, et al., filed Jun. 30, 1997, as Ser. No. 08/885,433.

FIELD OF THE INVENTION

The present invention relates generally to semiconductor manufacturing, and more particularly to, forming a metallic gate oxide layer for an MOS transistor which can be annealed with reduced silicon substrate oxidation.

BACKGROUND OF THE INVENTION

In the integrated circuit (IC) industry, the performance of metal oxide semiconductor (MOS) field effect transistor (FETs) are controlled by two primary device characteristics. The performance of a MOSFET device can be enhanced by reducing the length of a gate electrode of the MOSFET device, and/or reducing the gate dielectric thickness of the MOSFET device. The integrated circuit industry has progressed to a point where thermal gate oxide thickness is becoming less than roughly 60 angstroms. As gate dielectrics progress to a thickness less than 60 angstroms, a theoretical and practical limit to thermal gate oxidation is now being approached. Therefore, the integrated circuit industry is attempting to develop materials which can replace thermal oxides as gate dielectric materials in order to continue to progress the performance of MOS transistors to new levels.

For this purpose, high-k metal oxide materials have been proposed as a potential gate dielectric to replace thermal oxide gate dielectrics. Since the dielectric constant of metal oxide material is made greater than that of thermal oxide, a thicker metal oxide can be physically deposited while achieving a similar equivalent oxide thickness (EOT) of a thinner thermal oxide gate dielectric. For the purpose of illustration, a metal oxide gate dielectric deposited to a thickness of roughly 80 angstroms could be roughly equivalent to a thermal oxide gate dielectric deposited to a thickness of 20 angstroms in terms of MOSFET performance whereby thinner EOTs are more advantageous to MOSFET performance. This physical increase in gate dielectric thickness while maintaining similar levels of EOT/performance is advantageous since the physically thicker metal oxide can reduce gate-to-channel leakage current while MOSFET performance is not adversely impacted.

A first prior art solution for forming high-k metal gates in semiconductor devices has used tantalum pentoxide as a barrier formed over the semiconductor substrate. Following the formation of the tantalum pentoxide layer an anneal step has been performed. However, the step of annealing caused the formation of a silicon dioxide layer at the tantalum pentoxide and silicon substrate interface. This silicon dioxide barrier has been shown to be approximately 20–40 angstroms thick. Following the anneal step, a metal gate was formed over a top of the tantalum pentoxide. The overall effect of the metal tantalum pentoxide/silicon dioxide gate dielectric structure is the formation of series connected capacitors to be formed from the surface of the gate to the substrate. One of the capacitors is formed by the metal gate dielectric that has a higher dielectric constant while the second such capacitor is formed by the silicon dioxide layer that has a much lower dielectric constant. The results of this structure is such that the capacitance of the small-k dielectric material dominates whereby the improvement of the higher k metal oxide is reduced.

A second prior art method of using metal gates over silicon substrates formed a chemically grown $SiO_2$ layer over the silicon substrate. The advantage of growing the $SiO_2$ layer is that its thickness can be precisely controlled to approximately 20 angstroms and the $SiO_2$ interface state density of the Si interface is low. Subsequently, a tantalum pentoxide layer is formed on top of the silicon dioxide layer and a metal gate subsequently formed over of the tantalum pentoxide. While this prior art method reduces the thickness of the silicon dioxide over the previously discussed prior art method, the problem remains the same in that a capacitance formed by the silicon dioxide layer is such that it dominates the high-k dielectric layer whereby the improvement in the gate dielectric EOT is self-limited.

Therefore, it would be advantageous to form a metal gate structure whereby the dominant capacitance effects of a silicon dioxide layer are minimized.

Figure 1:
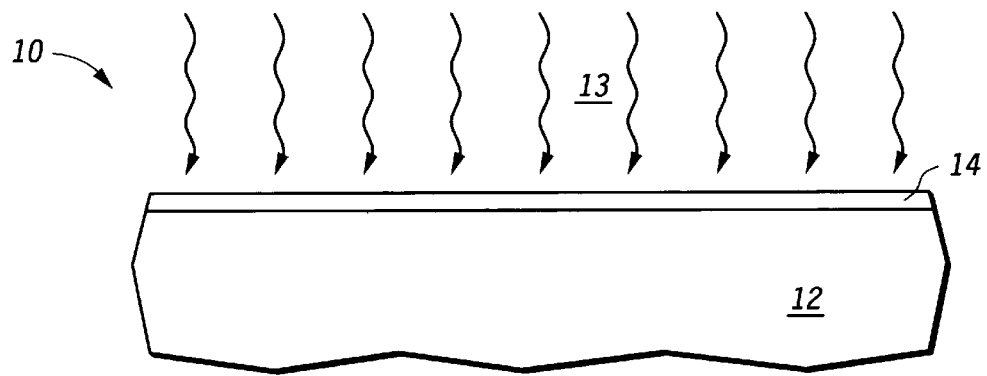
FIGS. 1, 2 and 3 illustrate, in cross-sectional diagrams, an improved gate dielectric formation in accordance with the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method for forming a high-k metal oxide gate dielectric which enhances transistor performance while limiting or eliminating the capacitance-limiting presence of $SiO_2$ layers in the gate oxide stack. The improved metal oxide gate dielectric is formed over a nitrided layer which prevents substrate oxidation. The nitrided layer has been formed over the silicon substrate in order to prevent the formation of lower k oxide films which could compromise the effective oxide thickness (EOT) of the metal oxide gate dielectric.

Figure 2:
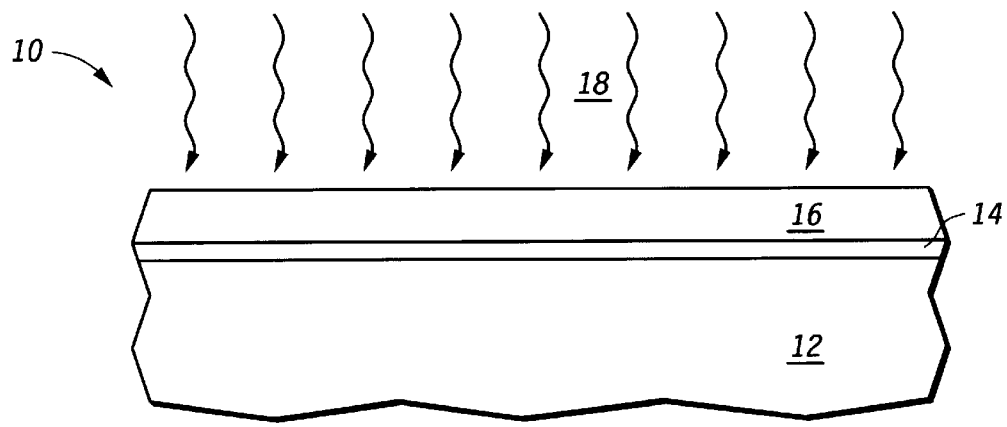
Figure 3:
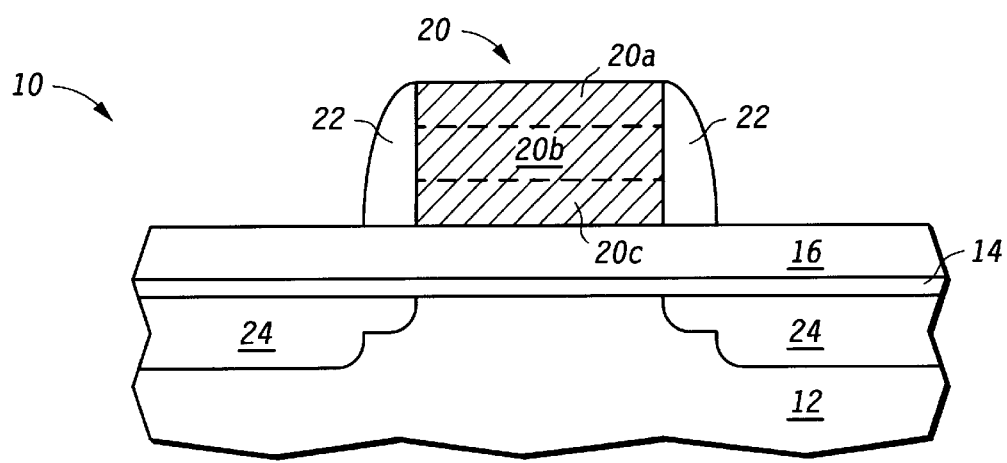

The present invention is best understood with reference to the FIGS. 1–3.

In FIG. 1, a semiconductor substrate 12, which has preferably been pre-cleaned in order to minimize the oxide at its surface with an HF clean and/or hydrogen ($H_2$) anneal step. In an alternative, a plasma $N_2O$ process may be used to remove substrate native oxide and create a mono-layer of nitrogen passivation on the surface of the substrate 12 which prevents substantial oxidation of the surface of substrate 12.

The substrate 12 is preferably silicon, but may be any substrate which supports integrated circuit (IC) formation. After cleaning/passivation, the clean substrate 12 is then exposed to a nitridation agent 13. The nitridation agent/environment 13 will preferably be either ammonia ($NH_3$) or nitric oxide (NO) but could be an $N_2O$ source or an $N_2$ source. The nitrogen exposure may be through plasma, ion implantation, optical excitation (e.g., UV), or thermal processing. In another form, the nitrogen environment may be the ion implanting of nitrogen into a thin oxide formed over the substrate or the ion implanting of nitrogen into the substrate to form one or more of oxynitride or silicon nitride. During the exposure of the substrate 12 to the agent 13, a thin nitrided layer 14 is formed. The nitrided layer 14 will generally be a silicon nitride or a silicon oxynitride layer. The silicon nitride and silicon oxynitride may or may not be stoichometric. The layer 14 is formed so that it generally will be less than 20 angstroms in thickness and preferably between 2 and 15 angstroms in thickness. The permittivity (referred to as $\epsilon$ or k) of the layer 14 is in the range of 3.9–7.8. Generally, layer 14 is of any permittivity greater than 3.9.

Because the nitrided layer 14 is both very thin and has a permittivity of greater than 3.9 (which is greater than $SiO_2$), this layer 14 will not have as much of an adverse effect on the overall effective gate oxide thickness (EOT) as the prior art $SiO_2$ processes. In addition, the layer 14 will prevent oxidation of the substrate whereby this improvement to EOT is maintained through the IC processing.

FIG. 2 illustrates the formation of a metal oxide gate layer 16. in one embodiment, the metal oxide gate dielectric layer 16 is formed by the deposition 18 of a metal film followed by an oxidizing ambient. In another embodiment, the environment 18 would be a chemical vapor deposition (CVD) of a metal oxide followed by an oxygen anneal to reduce oxygen vacancies in the metal oxide film. Such CVD metal oxide depositions or metal sputtering followed by $O_2$ anneal would include the formation of tantalum pentoxide, titanium dioxide ($TiO_2$), yttrium oxide ($Y_2O_3$), niobium oxide ($Nb_2O_5$), zirconium oxide ($ZrO_2$), hafnium oxide ($HfO_2$), lead zirconium titanate (PZT), barium strontium titanate (BST), calcium oxide (CaO), beryllium oxide (BeO), magnesium oxide (MgO), and strontium bismuth titanate (SBT). In addition to the deposition of metal oxide gate dielectric layer using CVD, it is possible to deposit a metal layer by sputtering and subsequently perform an oxidation step on the deposited layer and also perform CVD of a metallic oxide to form a composite metal layer. In this approach, any of the previously listed metals, tantalum, titanium, yttrium, niobium, zirconium or hafnium, could conceivably be deposited in metal form forming a layer and subsequently oxidized during an annealing step.

In addition, it would be understood by one skilled in the art that it would be possible to form alloys and/or composite oxides from the above listed metals using various CVD processes, oxidation processes, and/or nanolaminate processing. For example, it would be possible in a single deposition or CVD step to deposit tantalum and titanium at the same time or serially in time, thereby forming a tantalum titanium oxide structure as the final metal oxide gate. Nanolaminate allows for a composite oxide to be formed one atomic layer at a time comprising one or more metallic oxide materials.

The metal oxide gate layer 16 will be a high-k dielectric layer. Typical permittivity values, depending upon the metal or alloy used to form the oxide layer 16, will be in the range of k=7.0 through 1500. Where tantalum pentoxide is used, a permittivity k or $\epsilon$ of approximately 25 is obtained. Therefore, where tantalum pentoxide forms the metal oxide gate layer, it can have a thickness of approximately 100 angstroms and have the same equivalent $SiO_2$ thickness of 20 angstroms for a conventional gate oxide layer. The 100 angstroms thickness of the tantalum pentoxide gate would reduce the amount of leakage current across the gate dielectric structure while still improving the overall performance of the semiconductor structure by maintaining or reducing the effective gate oxide thickness (EOT). Following the formation of the high-k dielectric layer 16, an oxidizing ($O_2$) anneal step, or other anneal process for improving the molecular quality, can be performed in order to reduce defects in of the dielectric layer.

The process taught herein has an additional advantage. Unlike the prior art which forms the high-k dielectric directly on the surface of the substrate whereby a thermal oxide subsequently forms between the high-k dielectric and the substrate, this process forms a chemically stable film on top of the substrate before formation of the high-k material. The oxynitride or silicon nitride layer 14 is chemically stable in the presence of silicon whereas many metallic oxides are not stable in the presence of silicon. Therefore, the prior art cannot use these unstable metal oxides whereas the layer 16 herein may be a chemically unstable oxide in the presence of silicon, such as tantalum pentoxide ($Ta_2O_5$), titanium dioxide ($TiO_2$), lead zirconium titanate (PZT), barium strontium titanate (BST), strontium bismuth titantate (SBT), niobium oxide ($Nb_2O_3$ or $Nb_2O_5$) while still preventing the adverse oxidation of the substrate during metal oxide oxidizing anneal.

Next, as illustrated in FIG. 3, a metal gate 20 is formed atop the metal oxide dielectric layer 16 to function as a gate electrode of an MOS transistor. In addition, dielectric spacers 22 are formed as well to complete the transistor 10 and allow for formation of lightly doped drain (LDD) transistor structures. In a preferred embodiment, the metal gate 20 is formed with a multi-layer metal/semiconductor process. This is used in order to assure oxidation of the metal layer 20 does not occur and to avoid polysilicon depletion which affects EOT. For example, the metal layer 20 could include titanium nitride (TiN) as a lower metal portion. The formation of TiN, if left exposed to ambient would be susceptible to an oxidation of the gate structure, thereby reducing its overall reliability and effectiveness. Therefore, in FIG. 3, the portion 20c could comprise titanium nitride, the portion 20b would comprise a polysilicon cap, and the portion 20a would comprise a refractory metal silicide polysilicon region. One or more of regions 20a and 20c could effectively provide an oxygen barrier between the TiN and the external ambient. Note that the metal portion 20c could be any conductive metal-containing layer while the layer 20a could be any silicide or salicide. This composite metal-polysilicide or metal-poly gate structure maintains optimized EOT while providing a high performance gate structure.

In yet another embodiment of the present invention, it may be desirable to use a metal stack for gate 20 which would be chosen in order to alleviate stress between various layers of the semiconductor device. For example, it may be desirable to form layer 20a as illustrated in FIG. 3 from a TiN layer and an upper portion 20b/20c to be formed from tungsten in order to reduce stresses which will occur at the interconnect interface along the top portion of the gate, or along the gate oxide 16.

While the present invention has been illustrated and described with reference to specific embodiments, further modifications and improvements will occur to those skilled in the art. For example, the gate electrodes taught herein may be all metal and contain no polysilicon. The layer 14 herein is discussed as being silicon nitride or an oxynitride. It is important to note that this layer could also be formed from a high-k dielectric material that is an oxidation barrier and/or chemically stable in contact with silicon. In addition, the present invention could be used for inlaid gates as well as conventional gates. It is to be understood, therefore, that this invention is not limited to the particular use illustrated and that it is intended in the appended claims to cover all modifications that do not depart from the spirit and scope of this invention.

What is claimed is:

1. A method for forming a semiconductor structure, the method comprising the steps of:

providing a semiconductor substrate having a surface;

forming an oxidation barrier layer over the surface of the semiconductor substrate;

forming a metal oxide layer over the oxidation barrier layer; and forming a gate electrode overlying the metal oxide layer and forming source and drain electrodes within the semiconductor substrate wherein the gate electrode controls current flow between source and drain electrodes using the oxidation barrier layer and the metal oxide layer as a composite gate dielectric layer.

2. The method of claim 1 wherein the step of forming a metal oxide layer comprises:

selecting a metal oxide layer which is not chemically stable in a presence of silicon.

3. The method of claim 2 wherein the step of forming a metal oxide layer comprises:

selecting the metal oxide layer from the group consisting of: tantalum pentoxide ($Ta_2O_5$), titanium dioxide ($TiO_2$), lead zirconium titanate (PZT), barium strontium titanate (BST), strontium bismuth titantate (SBT), and niobium oxide ($Nb_2O_3$ or $Nb_2O_5$).

4. The method of claim 1 wherein the step of forming a metal oxide layer comprises:

selecting a metal oxide layer which is chemically stable in a presence of silicon.

5. The method of claim 4 wherein the step of forming a metal oxide layer comprises:

selecting the metal oxide layer from the group consisting of: yttrium oxide ($Y_2O_3$), zirconium oxide ($ZrO_2$), calcium oxide (CaO), beryllium oxide (BeO), and magnesium oxide (MgO).

6. The method of claim 1 wherein the step of forming a metal oxide layer comprises:

sputtering a metallic material on the oxidation barrier layer; and exposing the metallic material to an oxidation environment wherein the oxidation environment changes the metallic material to a metal oxide material, wherein the oxidation barrier layer prevents a region of the semiconductor substrate that is in close proximity to the composite gate dielectric layer from being significantly oxidized.

7. The method of claim 1 wherein the step of forming a metal oxide layer comprises:

chemical vapor depositing a metallic oxide material on the oxidation barrier layer; and exposing the metallic oxide material to an anneal environment wherein the anneal environment reduces oxygen vacancies and improves the bonding in the metallic oxide material, wherein the oxidation barrier layer prevents a region of the semiconductor substrate that is in close proximity to the composite gate dielectric layer from being significantly oxidized.

8. The method of claim 1 wherein the step of forming a gate electrode comprises:

forming the gate electrode having a lower portion made of a metallic material and an upper portion made of a polysilicon material.

9. The method of claim 8 wherein the step of forming a gate electrode comprises:

siliciding a top portion of the polysilicon material to form a top silicide portion of the gate electrode.

10. The method of claim 1 wherein the step of forming the oxidation barrier layer comprises:

forming the oxidation barrier layer as an oxynitride layer.

11. The method of claim 10 wherein the step of forming the oxidation barrier layer comprises:

exposing the semiconductor substrate to an environment provided with a source gas selected from the group consisting of: $N_2O$, NO, $NH_3$, and $N_2$.

12. The method of claim 10 wherein the step of forming the oxidation barrier layer comprises:

ion implanting an oxide formed over the semiconductor substrate with nitrogen atoms.

13. The method of claim 1 wherein the step of forming the oxidation barrier layer comprises:

forming the oxidation barrier layer between 2 angstroms and 15 angstroms in thickness.

14. The method of claim 1 wherein the step of forming the oxidation barrier layer comprises:

forming the oxidation barrier layer having a dielectric constant greater than 3.9.

15. The method of claim 1 wherein the steps of forming the oxidation barrier layer and the metal oxide layer comprises:

forming the oxidation barrier layer as a material that is chemically stable when exposed to silicon; and forming the metal oxide layer as a layer which is not stable in a presence of silicon.

16. The method of claim 1 wherein the step of forming the oxidation barrier layer comprises:

cleaning the semiconductor substrate with HF and passivating a top surface of the semiconductor substrate with a $H_2$ environment before formation of the oxidation barrier layer.

17. The method of claim 1 wherein the step of forming the metal oxide layer comprises:

forming the metal oxide layer as a composite metal oxide layer having a first metal oxide layer overlying a second metal oxide layer wherein the first metal oxide layer is different from the second metal oxide layer.

18. The method of claim 17 wherein the step of forming the metal oxide layer comprises:

forming the first metal oxide layer by depositing one or more atomic layers via atomic layer epitaxy; and forming the second metal oxide layer by depositing one or more atomic layers via atomic layer epitaxy.

19. The method of claim 1 wherein the step of forming the oxidation barrier layer comprises:

ion implanting nitrogen atoms into the semiconductor substrate to form silicon nitride as the oxidation barrier layer.

20. The method of claim 1 further comprising the step of:

passivating a surface of the semiconductor substrate so that oxidation on the semiconductor substrate is reduced before the oxidation barrier is formed.

21. The method of claim 1 wherein the step of forming the gate electrode comprises:

forming the gate electrode having a TiN portion and a W portion to reduce stress in the semiconductor structure.

22. A method for forming a semiconductor structure, the method comprising the steps of:

providing a semiconductor substrate having a surface;

forming an oxidation barrier layer over the surface of the semiconductor substrate by exposing the semiconductor substrate to a nitrogen environment, the oxidation barrier layer having a dielectric constant between 3.9 and 8.0;

forming a metal oxide layer over the oxidation barrier layer, the metal oxide layer having a dielectric constant above 7.8;

forming a metallic gate electrode overlying the metal oxide layer; and forming source and drain electrodes within the semiconductor substrate and self-aligned to the metallic gate electrode wherein the gate electrode controls current flow between source and drain electrodes using the oxidation barrier layer and the metal oxide layer as a composite gate dielectric layer.

23. The method of claim 22 wherein the steps of forming the oxidation barrier layer and the metal oxide layer comprises:

forming the oxidation barrier layer as a material that is chemically stable when exposed to silicon; and forming the metal oxide layer as a layer which is not stable in contact with silicon.

24. The method of claim 22 wherein the step of forming a metal oxide layer comprises:

sputtering a metallic material on the oxidation barrier layer; and exposing the metallic material to an oxidation environment wherein the oxidation environment changes the metallic material to a metal oxide material, wherein the oxidation barrier layer prevents a region of the semiconductor substrate that is in close proximity to the composite gate dielectric layer from being significantly oxidized.

25. The method of claim 22 wherein the step of forming a metal oxide layer comprises:

chemical vapor depositing a metallic oxide material on the oxidation barrier layer; and exposing the metallic oxide material to an oxidation environment wherein the oxidation environment anneals oxygen vacancies in the metallic oxide material, wherein the oxidation barrier layer prevents a region of the semiconductor substrate that is in close proximity to the composite gate dielectric layer from being significantly oxidized.

26. A method for forming a semiconductor structure, the method comprising the steps of:

providing a silicon substrate;

annealing the silicon substrate in a hydrogen-containing environment to passivate a surface of the silicon substrate;

forming an oxidation barrier layer over the surface of the silicon substrate by exposing the semiconductor substrate to a nitrogen environment, the oxidation barrier layer having a dielectric constant between 3.9 and 8.0 and being chemically stable in contact to silicon;

forming a metal oxide layer over the oxidation barrier layer, the metal oxide layer having a dielectric constant above 7.8 and being chemically unstable in contact to silicon;

forming a metallic gate electrode overlying the metal oxide layer wherein a lower portion of the metallic gate electrode is made of a metal material, a middle portion of the metallic gate electrode is made of polysilicon, and an upper portion of the metallic gate electrode is made of a silicide material; and forming source and drain electrodes within the silicon substrate and self-aligned to the metallic gate electrode wherein the gate electrode controls current flow between source and drain electrodes using the oxidation barrier layer and the metal oxide layer as a composite gate dielectric layer.

* * * * *